United States Patent [19]
Koike

[11] Patent Number: 6,064,698
[45] Date of Patent: May 16, 2000

[54] METHOD AND APPARATUS FOR CODING

[75] Inventor: Takashi Koike, Tokyo, Japan

[73] Assignee: Sony Corporation, Tokyo, Japan

[21] Appl. No.: 08/972,476

[22] Filed: Nov. 18, 1997

[30] Foreign Application Priority Data

Nov. 19, 1996 [JP] Japan .................................. 8-307738

[51] Int. Cl.[7] .............................................. H04B 14/04
[52] U.S. Cl. ..................... 375/242; 375/243; 395/2.33; 341/51; 341/139
[58] Field of Search .................................. 375/242, 243; 704/229, 230, 206; 348/402; 341/139; 395/2.33, 2.14, 213

[56] References Cited

U.S. PATENT DOCUMENTS

| | | | |
|---|---|---|---|
| 5,805,770 | 9/1998 | Tsutsui ................................... | 395/2.33 |
| 5,825,310 | 10/1998 | Tsutsui ................................... | 341/51 |
| 5,825,320 | 10/1998 | Miyamori et al. ..................... | 341/139 |
| 5,841,474 | 11/1998 | Ueda et al. ............................. | 348/402 |

FOREIGN PATENT DOCUMENTS

WO 94/28633  12/1994  WIPO ............................. H03M 7/30

OTHER PUBLICATIONS

R. Crochiere et al., "Digital Coding of Speech in Sub-Bands," *The Bell System Technical Journal*, vol. 55, No. 8, Oct. 1976, pp. 1069–1085.

J. Princen et al., "Subband/Transform Coding Using Filter Bank Designs Based on Time Domain Aliasing Cancellation," ICASSP Apr. 6–9, 1987, vol. 4, pp. 2161–2164.

M. Krasner, "The Critical Band Coder—Digital Encoding of Speech Signals Based on the Perceptual Requirements of the Auditory System," ICASSP, Apr. 1980, pp. 327–331.

R. Zelinski et al., "Adaptive Transform Coding of Speech Signals," IEEE Transactions on Acoustics, Speech and Signal Processing, vol. ASSP–25, No. 4, Aug. 1977, pp. 299–309.

J. Rothweiler, "Polyphase Quadrature Filters—A New Subband Coding Technique," ICASSP, Apr. 14–16, 1983, vol. 3 of 3, pp. 1280–1283.

D. Huffman, "A Method for the Construction of Minimim–Redundancy Codes," Proceedings of the I.R.E., Sep. 1952, vol. 40, pp. 1098–1101.

*Primary Examiner*—Stephen Chin
*Assistant Examiner*—Shuwang Liu
*Attorney, Agent, or Firm*—Limbach & Limbach L.L.P.

[57] ABSTRACT

A code string having a changed compression ratio is regenerated at a high speed. A quantizing accuracy and a normalizing coefficient to be changed are calculated by a quantizing-accuracy and normalizing-coefficient determining circuit without needing to dequantize the generated code. Then, the previously generated code is requantized by a quantized-spectrum calculating circuit in accordance with the calculated quantizing accuracy and the normalizing coefficient.

5 Claims, 5 Drawing Sheets

METHOD AND APPARATUS FOR CODING

BACKGROUND OF THE INVENTION

1. Field of the Invention

The present invention generally relates to a coding apparatus and a coding method. More particularly, the invention relates to a coding apparatus and a coding method, both in which a code string having a changed compression ratio can be regenerated merely by requantizing signal components with less calculations and a simple construction at a high speed without needing to perform dequantizing and quantizing operations once again.

2. Description of the Related Art

Various types of high-efficiency audio-signal (including sound signals) coding methods are available. For example, a non-block-type frequency band division method, which is referred to as "the band-division coding method" (the sub-band coding (SBC) method), is employed. In this method, a time-base audio signal is divided into signal components in a plurality of frequency bands without being grouped into a plurality of blocks, and the divided signal components are then coded. A block-type frequency band division method, which is referred to as "a transform coding method", is also available. In this method, a time-based signal is transformed (spectrum-transformed) into a frequency-based signal, and the transformed signal is divided into signal components in a plurality of frequency bands. Then, the divided signal components are coded in the respective frequency bands. Further, a high-efficiency coding technique with a combination of the above-described sub-band coding method and transform coding method may be considered. In this technique, for example, a signal is first divided into signal components in a plurality of bands according to the sub-band coding method. The divided signal components in the bands are spectrum-transformed into frequency-based signal components, respectively, which are then coded according to the transform coding method.

As a filter used in the foregoing sub-band coding method, a quadrature mirror filter (QMF), for example, may be used. An example of the use of this filter is described in 1976 R. E. Crochiere *Digital coding of speech in subbands,* Bell Syst.Tech. J. Vol.55, No.8 1976. Also, an equal-bandwidth-filter division method is stated in ICASSP 83,BOSTON *Polyphase Quadrature filters—A new subband coding technique,* Joseph H. Rothweiler.

As the foregoing spectrum-transform coding method, the following technique of transforming a time-base signal into a frequency-base signal is available. An input audio signal is first grouped into blocks with a predetermined time unit (frame), and then, discrete Fourier transform (DFT), discrete cosine transform (DCT), or modified DCT (MDCT) are performed on the respective blocks of signal components. The MDCT operation is described in detail in *ICASSP* 1987 *Subband/Transform Coding Using Filter Bank Designs Based on Time Domain Aliasing Cancellation,* J. P. Princen A. B. Bradley Univ. of Surrey Royal Melbourne Inst.of Tech.

The signal which is divided into signal components in a plurality of bands by using a filter or by performing a spectrum-transform operation, as noted above, is quantized. Consequently, the bands in which quantizing noise is generated can be suppressed. By virtue of the masking effect, an aurally higher-efficiency coding operation can be performed. The coding operation can be performed with even higher efficiency if the signal components in each band are normalized by dividing them by the maximum of the absolute values of the signal components before the signal components are quantized.

The bandwidths in the sub-band coding method for quantizing an audio signal are determined in consideration of certain characteristics, such as human aural characteristics. For instance, an audio signal is divided into a plurality of (for example, 25) bands in such a manner that the bandwidth increases in a higher-frequency band, i.e., in a band closer to the critical band. Then, when data in each band is coded, a predetermined number of bits are distributed to each band, or a suitable number of bits are allocated to each band (bit allocation). For example, when the MDCT-processed coefficient data is coded by the above bit allocation, the MDCT coefficient data in each band is coded with a suitably allocated number of bits. As this bit allocation method, the following two techniques are known.

One technique is disclosed in *Adaptive Transform Coding of Speech Signals,* R. Zelinski and P. Noll, IEEE Transactions of Acoustics, Speech, and Signal Processing, vol. ASSP-25, No.4, August 1977. In this technique, bit allocation is conducted in accordance with the magnitudes of the signal components in the respective bands. This technique makes it possible to smooth the quantizing noise spectrum and to minimize the noise energy, but on the other hand, the actual acoustic noise is not optimally suppressed due to the absence of the masking effect.

The other technique is disclosed in ICASSP 1980, *The critical band coder—digital encoding of the perceptual requirements of the auditory system,* M. A. Kransner MIT. In this technique, aural masking is utilized to obtain a signal-to-noise ratio (S/N ratio) required for each band, thereby performing fixed bit allocation. In this technique, however, bit allocation is fixed on any block of signal components even when a sine-wave signal is input, thus failing to obtain very good characteristics.

In order to solve the foregoing problems, the following type of high-efficiency coding apparatus has been proposed. All the bits to be allocated are divided into fixed bits that are predetermined for the individual small blocks, and variable bits that are determined according to the magnitudes of respective blocks of signal components. The dividing ratio is determined by the type of input signal, and the ratio of the fixed-bit allocation is greater as the signal spectrum becomes smoother.

According to the above technique, a greater number of bits can be allocated to blocks including a spectrum having a greater amount of energy, such as a sine-wave signal, thereby significantly improving the overall S/N ratio. Since humans are, in general, highly sensitive to signals having sharp spectrum components, an improvement in the S/N ratio by employing this technique is effective not only for improving the measurements of the characteristics, but also for enhancing the acoustic sound quality.

In addition to the foregoing two techniques, a variety of techniques have been proposed for the bit allocation method. If the precision of an audio-related model is further increase, the performance of a coding apparatus is improved, thereby enabling an audio coding operation with even higher efficiency.

The following coding method has been previously proposed in PCT-published application No. WO94/28633 by the present inventor. Tones which are particularly important from an aural sense are separated from a spectrum signal and are coded independently of the other spectrum components. It is thus possible to efficiently code audio signals with a high compression ratio substantially without degrading the quality of audio signals.

If a DFT or DCT operation is employed to transform a waveform signal of a predetermined time block consisting of M number of samples into a spectrum signal, M number of independent items of real-number data are obtained. In order to reduce connection distortion between time blocks, each block is generally overlapped with adjacent blocks on both sides, each by an amount equal to M1 number of samples. Accordingly, in a DFT or DCT operation, on the average, M number of items of real-number data are quantized and coded in relation to (M−M1) number of samples.

In contrast, if an MDCT operation is employed to transform a waveform signal into a spectrum signal, M number of independent items of real-number data can be obtained from 2M number of samples in which each block is overlapped with adjacent blocks on both sides, each by an amount equal to M number of samples. Thus, in an MDCT operation, on the average, M number of items of real-number data are quantized and coded in relation to M number of samples.

In a decoding apparatus, the coded data obtained by performing an MDCT operation is inverse-transformed in the respective blocks into waveform elements, which are then added while interfering with each other, thereby reconstructing a waveform signal.

The resolving power of the frequency spectrum can be generally elevated by increasing the length of a time block used for signal transform, thereby making the energy concentrate on specific spectrum components. Accordingly, a block is overlapped with adjacent blocks on both sides, each by an amount equal to half of the block, and the, a waveform signal is transformed with an increased block length. Moreover, a coding operation an be executed with even higher efficiency by using MDCT than by using DFT or DCT because the number of items of spectrum data is the same as the number of original time samples. Additionally, adjacent blocks are overlapped with each other by a considerable amount, thereby reducing inter-block distortion of the waveform signal.

In order to construct a code string, a quantizing-accuracy information and normalizing-coefficient information, which are input together with the quantized and normalized signal, are first coded with a predetermined number of bits in each band of the signal, and the normalized and quantized spectrum signal is then coded.

For coding spectrum signals, a method using variable-length codes, such as Huffman codes, is known. Huffman codes are stated in, for example, David A. Huffman, *A Method for the Construction of Minimum—Redundancy Codes,* Proceedings of the I.R. E., pp.1098–1101, September 1952.

A coded string which has been generated in the above manner may sometimes be regenerated into a new code string by changing the compression ratio in response to a change in the capacity of the transmitting channel of a transmitting medium. The operation is generally performed in the following procedure. The original code string is temporarily resolved to decode signal components for adjusting the number of bits, and then, not only the frequency bands are restricted, but also a bit reallocation is made and quantizing accuracy and normalizing coefficients are changed. Subsequently, the signal is requantized to create a new code string.

FIG. 9 is a block diagram illustrating an example of a conventional circuit for changing the compression ratio of a previously generated code string. In this example, data coded by the coding apparatus is input into a signal-component decoding circuit 111. The decoding circuit 111 decodes (dequantizes) the input codes and outputs the decoded data to an inverse-transform circuit 112. The inverse-transform circuit 112 spectrum-inverse-transforms the codes corresponding to the input spectrum components into time-based codes and outputs the original data. The data is then retransformed into a spectrum signal by a transform circuit 113, and the spectrum signal is supplied to a normalizing circuit 114 and a quantizing-accuracy determining circuit 115.

The quantizing-accuracy determining circuit 115 determines the quantizing accuracy for the input spectrum signal and outputs the determined quantizing-accuracy information to a quantizing circuit 116. In the meantime, the normalizing circuit 114 normalizes the input spectrum-signal components and outputs the normalized data to the quantizing circuit 116. The quantizing circuit 116 then quantizes the normalized data input from the normalizing circuit 114 with the quantizing accuracy input from the quantizing-accuracy determining circuit 115.

The signal components RS (real number) obtained by dequantizing the original codes by the signal-component decoding circuit 111 are calculated according to the following equation in relation to the original normalizing coefficient SF(i) (integer), the original quantizing accuracy MQ(i) (integer), and the original quantized signal components (input signal) QS (integer).

$$RS = SF(i) * QS/(MQ(i)+0.5) \quad (1)$$

Each factor is a constant determined by each unit i.

The signal components QS' (integer) obtained by requantizing the original input signal QS by the quantizing circuit 116 are calculated according to the following equation in relation to the normalizing coefficient SF'(i) (integer) determined by the normalizing circuit 114, the quantizing accuracy MQ'(i) (integer) determined by the quantizing-accuracy determining circuit 115, and the dequantized signal components (input signal) RS (real number).

$$QS' = RS/SF'(i) * (MQ'(i)+0.5) \quad (2)$$

According to the foregoing known method, in order to regenerate a code string by changing the compression ratio of the original code string output from the coding apparatus, it is necessary to perform calculations by an amount substantially equal to the calculations required for decoding and recoding the original input signal. Thus, this method is not suitable for the type of processing which should be executed at high speed, for example, real-time processing for changing the compression ratio. Additionally, the calculated values of real numbers which are frequently used during processing must be stored, thereby increasing the size of the hardware.

SUMMARY OF THE INVENTION

Accordingly, in view of the above background, it is an object of the present invention to regenerate a code string having a higher compression ratio while requiring a small amount of calculations and a small hardware size by decreasing the number of calculations required for obtaining real numbers in a compression-ratio changing circuit.

In order to achieve the above object, according to one aspect of the present invention, there is provided a coding apparatus including: transform means for transforming an input signal into a spectrum component; normalization means for normalizing the spectrum component with the use of a first normalizing coefficient; quantization means for quantizing the normalized spectrum component into a first code with the use of a first quantizing accuracy; first-calculation means for calculating a second quantizing accuracy and a second normalizing coefficient from the first code; second-calculation means for calculating a second code from the first code with the use of the second quantizing accuracy and the second normalizing coefficient; and generating means for generating a code string from the second code.

According to another aspect of the present invention, there is provided a coding method including the steps of: a transform step of transforming an input signal into a spectrum component; a normalization step of normalizing the spectrum component with the use of a first normalizing coefficient; a quantization step of quantizing the normalized spectrum component into a first code with the use of a first quantizing accuracy; a first-calculation step of calculating a second quantizing accuracy and a second normalizing coefficient from the first code; a second-calculation step of calculating a second code from the first code with the use of the second quantizing accuracy and the second normalizing coefficient; and a generating step of generating a code string from the second code.

With the above arrangements, the quantizing accuracy and the normalizing coefficient are calculated from the first code. Then, a second code is calculated from the first code with the use of the calculated quantizing accuracy and the normalizing coefficient. Therefore, a code string having a changed compression ratio can be regenerated at high speed with a small number of calculations and a simple construction.

DESCRIPTION OF THE PREFERRED EMBODIMENT

Before exploiting the preferred embodiment of the present invention, in order to clarify the relationships between the means and the steps set forth in the claims and the elements used in the following embodiment, the features of the present invention will be explained by adding the corresponding elements (only examples) in parentheses after the respective means and steps. The following description is not intended to limit the means and the steps set forth in the claims.

Figure 1:
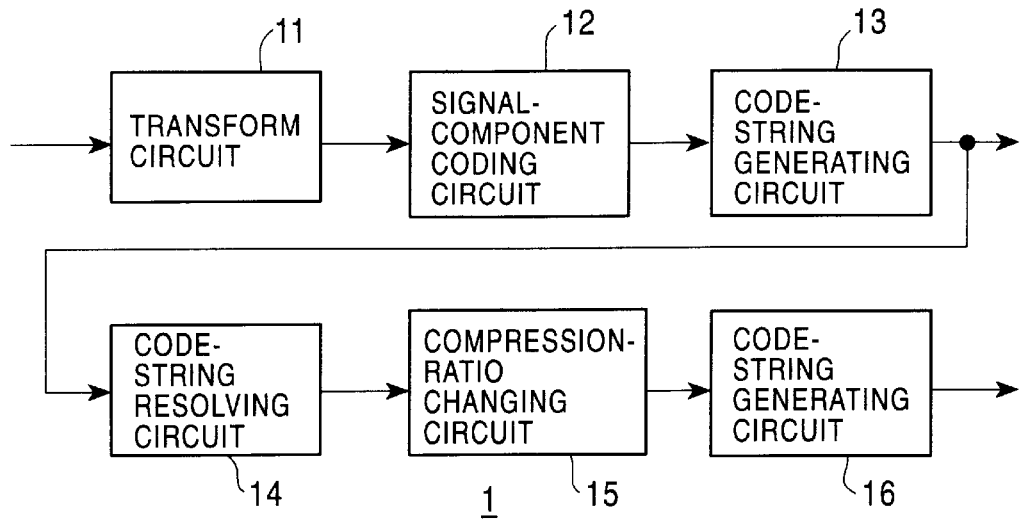
FIG. 1 is a block diagram illustrating the configuration of a coding apparatus according to an embodiment of the present invention.
Figure 3:
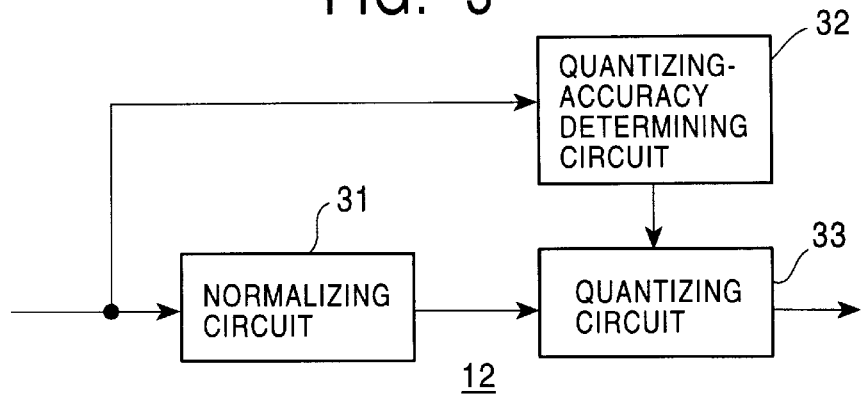
FIG. 3 is a block diagram illustrating the configuration of the signal-component coding circuit shown in FIG. 1.
Figure 4:
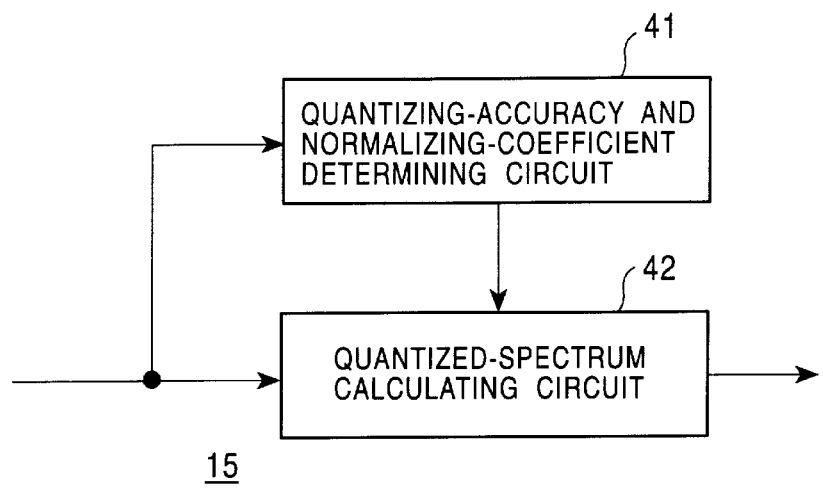
FIG. 4 is a block diagram illustrating the configuration of the compression-ratio changing circuit shown in FIG. 1.

The coding apparatus of the present invention has transform means for transforming an input signal into spectrum components (a transform circuit 11 shown in FIG. 1), normalizing means for normalizing the spectrum components (a normalizing circuit 31 shown in FIG. 3), quantizing means for quantizing the normalized spectrum components into a first code (a quantizing circuit 33 illustrated in FIG. 3), first-calculation means for calculating quantizing accuracy and normalizing coefficient from the first code (a quantizing-accuracy and normalizing-coefficient determining circuit 41 illustrated in FIG. 4), second-calculation means for calculating a second code from the first code by using the calculated quantizing accuracy and normalizing coefficient (a quantizing spectrum calculating circuit 42 shown in FIG. 4), and generating means for generating a code string from the second code (a code-string generating circuit 16 shown in FIG. 1).

The coding method of the present invention includes a transform step of transforming an input signal into spectrum components (the transform circuit 11 shown in FIG. 1), a normalizing step of normalizing the spectrum component (the normalizing circuit 31 shown in FIG. 3), a quantizing step of quantizing the normalized spectrum components into a first code (the normalizing circuit 31 shown in FIG. 3), a first-calculation step of calculating the quantizing accuracy and the normalizing coefficient from the first code (the steps S1 through S8 of the flow chart illustrated in FIG. 6), a second-calculation step of calculating a second code from the first code by using the calculated quantizing accuracy and normalizing coefficient (steps S1 through S8 of the flow chart illustrated in FIG. 6), and a generating step of generating a code string from the second code (the code-string generating circuit 16 shown in FIG. 1).

The preferred embodiment of the present invention will now be explained with reference to the drawings.

FIG. 1 is a block diagram illustrating an acoustic-wave signal coding apparatus according to an embodiment of the present invention. In a coding apparatus generally designated by 1, an input acoustic-wave signal is transformed into signal frequency components by a transform circuit 11. The respective components are then coded by a signal-component coding circuit 12, and a code string is then generated by a code-string generating circuit 13.

The code string is then normally output from the coding apparatus 1. If, however, it is desired that the compression ratio of the code string be changed, the generated code string is further supplied to a subsequent stage of a code-string resolving circuit 14. In the resolving circuit 14, codes of the respective signal components are extracted from the code string, and the resolved codes are changed by a compression-ratio changing circuit 15. Then, a code string is regenerated by a code-string generating circuit 16.

Figure 2:
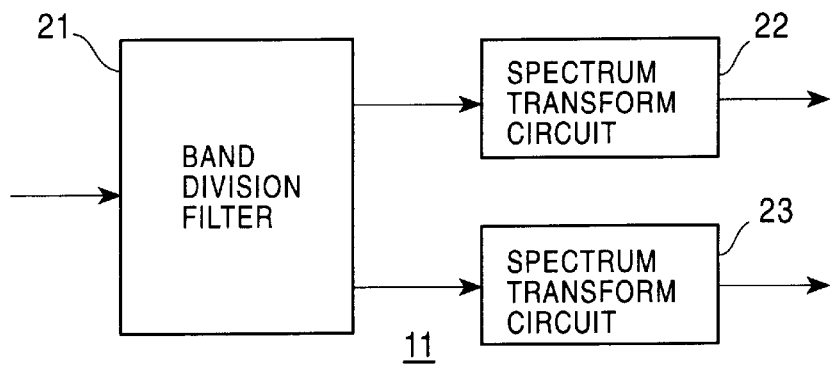
FIG. 2 is a block diagram illustrating the configuration of the transform circuit shown in FIG. 1.

Referring to the block diagram illustrated in FIG. 2, the transform circuit 11 divides the input signal into two frequency-band signals by a band division filter 21 and outputs them to spectrum transform circuits 22 and 23, respectively. The spectrum transform circuits 22 and 23 transform the input band-signals into spectrum signal components by a MDCT operation. Each of the band signals output form the band division filter 21 is reduced to one half of the original signal, and the number of data items of each of the bank signals is also reduced to one half of that of the original signal.

As the transform circuit 11, many configurations other than this embodiment shown in FIG. 2 may be considered. For example, an input signal may be transformed into spectrum signal components by a DFT or DCT operation. The coding method of the present invention is particularly effective for signals having high energy concentrated in specific frequency components. Thus, the foregoing spectrum transform method using MDCT in which a large number of frequency components can be obtained with a small amount of calculations is preferably employed for the above types of signals.

FIG. 3 is a block diagram illustrating the configuration of the signal-component coding circuit 12. The spectrum signals output from the spectrum transform circuits 22 and 23 are input into normalizing circuit 1 and quantizing-accuracy determining circuit 32. The normalizing circuit 31 divides the input spectrum signal into a plurality of components in predetermined frequency bands. The normalizing circuit 31 then normalizes the components by dividing them by the maximum of the components and outputs normalized signal components together with normalizing information to a quantizing circuit 33.

Meanwhile, the quantizing-accuracy determining circuit 32 determines the quantizing accuracy of the input spectrum signal and outputs it to the quantizing circuit 33. Then, the quantizing circuit 33 quantizes the normalized spectrum signal output form the normalizing circuit 31 with the quantizing accuracy determined by the quantizing-accuracy determining circuit 32. The quantizing circuit 33 then outputs the quantized signal together with the normalizing-coefficient information and the quantizing-accuracy information to the code-string generating circuit 13.

Referring to the block diagram illustrating the configuration of the compression-ratio changing circuit 15 shown in FIG. 4, the codes output from the code-string resolving circuit 14 are input into a quantizing-accuracy and normalizing-coefficient determining circuit 41 and a quantized-spectrum calculation circuit 42. The quantizing-accuracy and normalizing-coefficient determining circuit 41 determines the quantizing accuracy and the normalizing coefficient from the input code by calculations and outputs them to the quantized-spectrum calculation circuit 42. The quantizing-spectrum calculating circuit 42 requantizes the codes supplied from the code-string resolving circuit 14 based on the quantizing accuracy and the normalizing coefficient output from the quantizing-accuracy and normalizing-coefficient determining circuit 41. The calculating circuit 42 then outputs the requantized signal together with the normalizing-coefficient information and the quantizing-accuracy information to the code-string generating circuit 16.

The operation performed by the foregoing coding apparatus 1 will now be described in detail. In the transform circuit 11, the band division filter 21 divides an input audio signal into a higher-frequency band component and a lower-frequency band component and outputs them to the spectrum transform circuits 22 and 23, respectively. The spectrum transform circuit 22 transforms the input higher-frequency band component into a spectrum signal component by MDCT, while the spectrum transform circuit 23 transforms the input lower-frequency band component into a spectrum signal component by MDCT.

Figure 5:
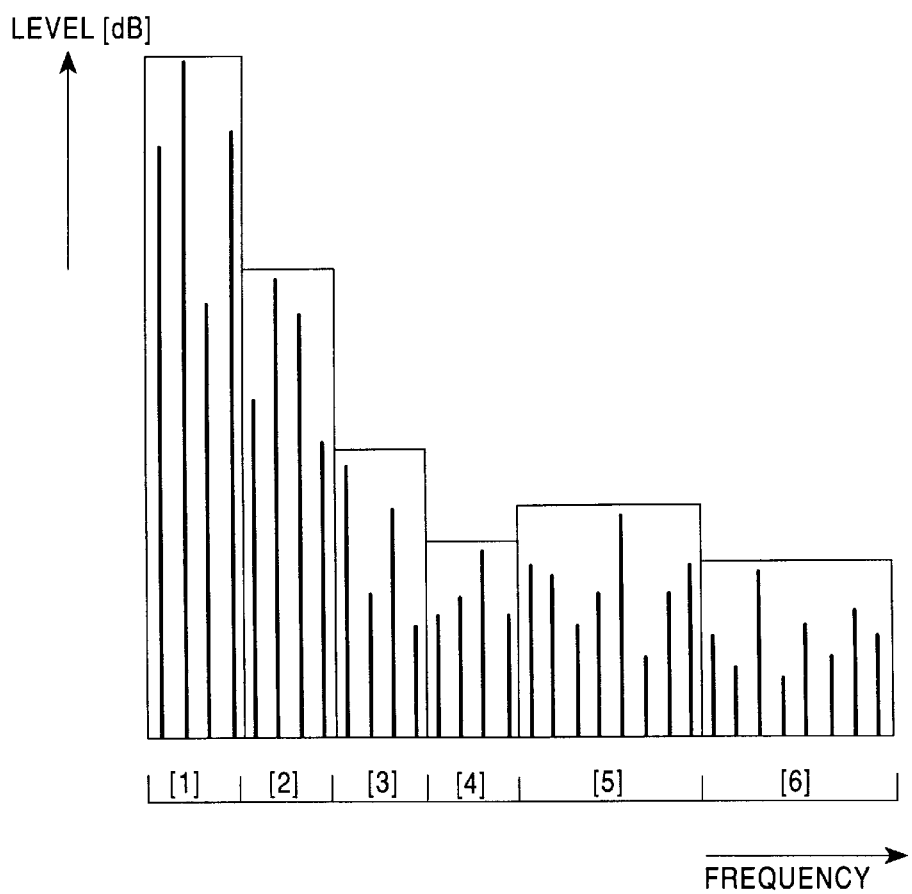
FIG. 5 illustrates a spectrum signal.

FIG. 5 illustrates the spectrum signal obtained by converting the levels of the absolute values of the MDCT-processed spectrum components into decibels (dB). The input signal components in predetermined time blocks have been transformed into 32 spectrum signal components by the spectrum transform circuits 22 and 23. The spectrum components are formed into 6 coding units [1] through [6], and each unit is then normalized and quantized.

In the signal-component coding circuit 12, the normalizing circuit 31 normalizes the components by obtaining the maximum value in each coding unit and dividing the other components by the maximum value. The normalizing circuit 31 then outputs the resulting values to the quantizing circuit 33.

In the meantime, the quantizing-accuracy determining circuit 32 determines the quantizing accuracy of the input spectrum signal components of each unit and outputs them to the quantizing circuit 33. The quantizing circuit 33 quantizes the normalized spectrum signal components based on the quantizing accuracy determined by the quantizing-accuracy determining circuit 32 and outputs the quantized signal components to the code-string generating circuit 13. The code-string generating circuit 13 transforms the codes output from the quantizing circuit 33 into a code string.

The quantizing accuracy is varied between the coding units in accordance with the distribution of the frequency components, thereby making it possible to perform a highly efficient coding operation while substantially maintaining sound quality. The quantizing-accuracy information required for each coding unit is obtained based on, for example, an acoustic model, by calculating a minimum audible level and masking level in a band corresponding to each coding unit. The normalized and quantized spectrum signal components are transformed into variable-length codes together with the quantizing-accuracy information and the normalizing-coefficient information in the respective coding units.

If it is necessary that the compression ratio of the code string generated by the code-string generating circuit 13 be changed, the code string is input into the code-string resolving circuit 14 in which the code string is resolved into the original codes, i.e., the codes output form the signal-component coding circuit 12. The codes are then input into the quantizing-accuracy and normalizing-coefficient determining circuit 41 and the quantized-spectrum calculating circuit 42 of the compression-ratio changing circuit 15.

In determining the quantizing accuracy and the normalizing coefficient, the quantizing-accuracy and normalizing-coefficient determining circuit 41 refers to the original quantizing accuracy, which is determined by the quantizing-accuracy determining circuit 32, and to the original normalizing coefficient, which is used in the normalizing circuit 31, rather than dequantizing the original signal components. The determining circuit 41 then recalculates the number of bits by changing the quantizing accuracy and normalizing coefficient in a stepwise fashion so as to adjust the coded bit length. For instance, the types of codes corresponding to the respective signal components can be, in general, reduced by decreasing the quantizing accuracy, thereby decreasing the length of a code string. Moreover, when the signal components are coded by using variable-length codes, the length of a code string can be decreased by adjusting the normalizing coefficient.

Figure 6:
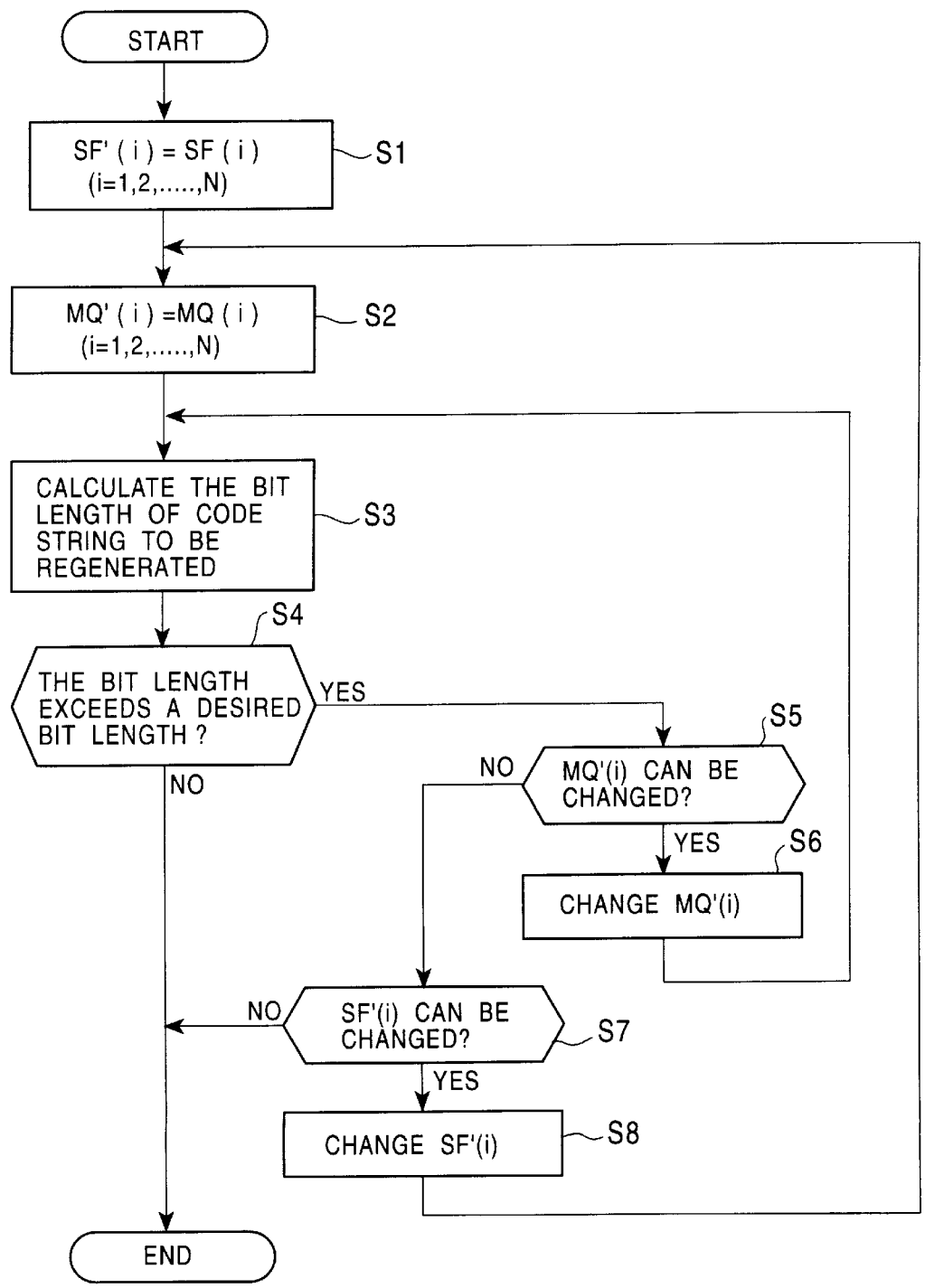
FIG. 6 is a flow chart illustrating the operation of the compression-ratio changing circuit shown in FIG. 4.

FIG. 6 is a flow chart illustrating the overall processing when the compression-ratio changing circuit 15 adjusts the number of bits of a code string having N number of coding units, a normalizing coefficient SF(i) in each coding unit, and a quantizing accuracy MQ(i).

In step S1, the initial value of the normalizing coefficient SF'(i) in each coding unit is set to be SF(i). In step S2, the initial value of the quantizing accuracy MQ'(i) is set to be MQ(i). Then, in step S3, according to the following equation (3) obtained by substituting the foregoing equation (1) into equation (2), a signal component QS', which is equal to the value by requantizing the originally quantized signal component QS, is calculated so as to determine the bit length required for the coding operation by all the coding units.

$$QS' = SF(i)*(MQ'(i)+0.5)/(MW(i)+0.5)*QS \quad (3)$$

In step S4, it is checked whether the bit length of a code string to be regenerated exceeds a desired bit length. If the answer to the query in S4 is yes, processing proceeds to a step of changing the quantizing accuracy and the normalizing coefficient. It is determined in step S5 whether the quantizing accuracy can be changed prior to the normalizing coefficient. If the answer to the question in S5 is yes, the processing proceeds to step S6. If the answer in S5 is no, the processing proceeds to step S7.

It is theoretically possible to check the normalizing coefficient before the quantizing accuracy. If the normalizing coefficient is checked first, however, the possibility of compressing the resulting codes would be lower. Then, it is preferable to first check whether the quantizing accuracy can be changed. If it is found that a high compression effect has not been obtained by changing the quantizing accuracy, the normalizing coefficient is modified.

In step S6, the quantizing accuracy is changed. At this time, the quantizing accuracy is preferably changed so that the resulting code string has a small number of bits. For example, the types of codes corresponding to the respective signal components are generally reduced by lowering the quantizing accuracy, thus making it possible to decrease the length of a requantized code string. The quantizing accuracy may be changed at a fixed level or different levels among the coding units. After step S6 in which the quantizing accuracy MQ'(i) has been changed, the processing returns to step S3, and the processing repeats the subsequent steps.

If it is found in step S5 that the quantizing accuracy cannot be changed, the processing proceeds to step S7. It is checked in step S7 whether the normalizing coefficient can be modified. If the answer in S7 is yes, the processing proceeds to step S8 in which the normalizing coefficient is changed. At this time, the normalizing coefficient is preferably modified so that the resulting string code has a small bit length. For example, if variable-length codes that will improve the coding efficiency when the normalized and quantized values are distributed near zero are used, the normalizing coefficient may be increased. The codes are then requantized with an increased normalizing coefficient so that a greater number of signal components are requantized to be zero. As a consequence, the length of a code string can be decreased. The normalizing coefficient may be modified with a fixed level or different levels among the coding units. After step S8 in which the normalized coefficient SF'(i) has been modified, the processing returns to step S3, an the processing repeats the subsequent steps.

In this manner, when the desired bit length of the code string to be regenerated is reached, processing is completed. Further, if the desired bit length of the code string to be regenerated is not reached even by any considerable combination of quantizing accuracy and the normalizing coefficient, the processing is completed.

As has been discussed above, since the requantized signal component QS' is directly calculated from the originally quantized signal component QS, it is unnecessary to determine and store the respective requantized signal components RS(i) (real numbers), thereby reducing the amount of calculations and also decreasing the size of the hardware.

Figure 7:
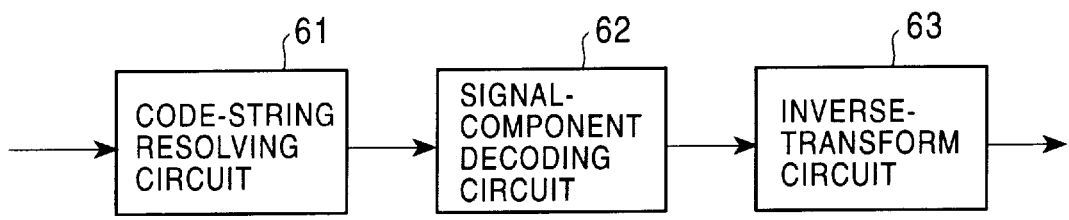
FIG. 7 is a block diagram illustrating the configuration of a decoding apparatus.

FIG. 7 is a block diagram illustrating the configuration of a decoding apparatus that decodes and outputs an acoustic-wave signal from the code string generated by the encoding apparatus 1 shown in FIG. 1. In a decoding apparatus generally designated by 51, an input code string is resolved by a code-string resolving circuit 61 to extract the codes of the respective signal components. The extracted codes are then supplied to a signal-component decoding circuit 62. The decoding circuit 62 then decodes (dequantizes) the input codes and outputs the decoded signal components to an inverse-transform circuit 63. The inverse-transform circuit 63 transforms the input spectrum signal components into an acoustic-wave signal and outputs it.

Figure 8:
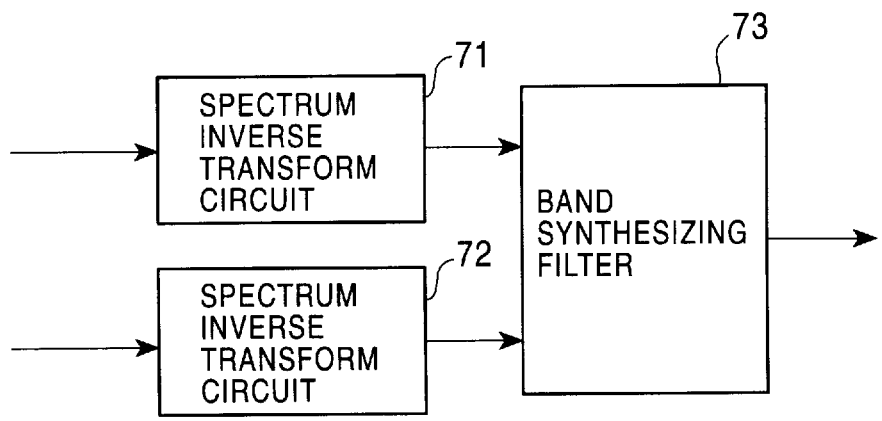
FIG. 8 is a block diagram illustrating the configuration of the inverse transform circuit shown in FIG. 7.
Figure 9:
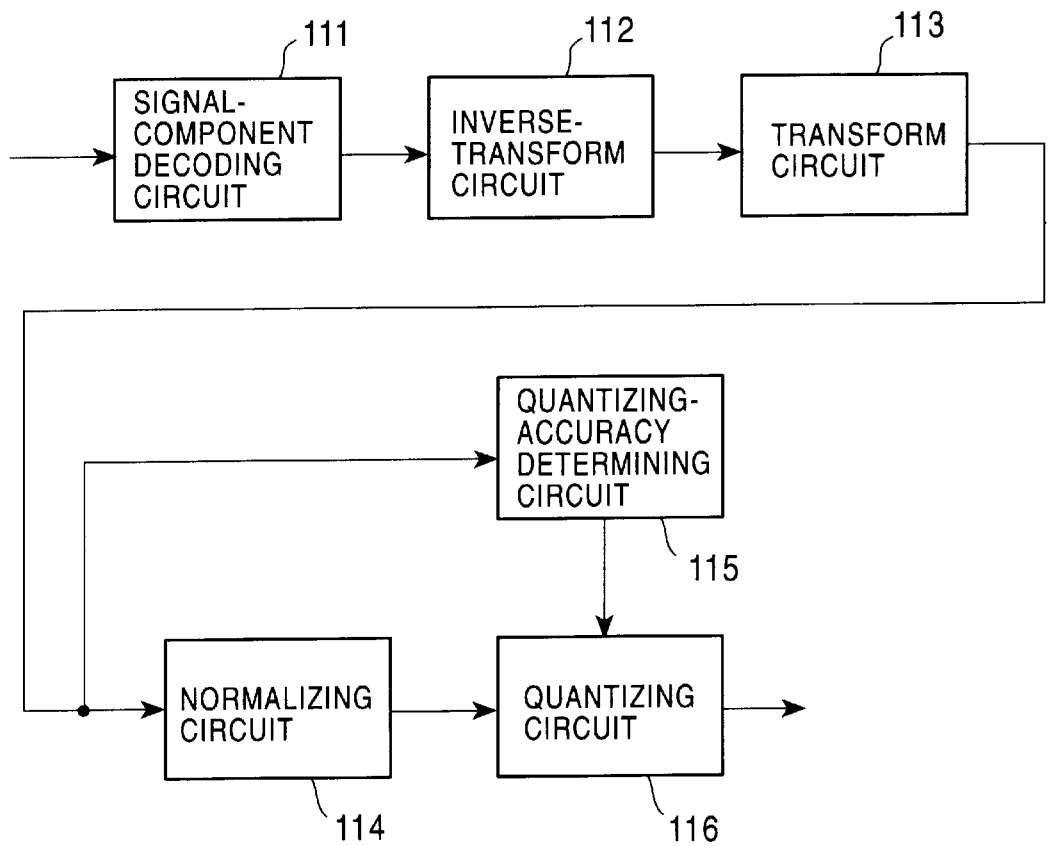
FIG. 9 is a block diagram illustrating the configuration of a known compression-ratio changing circuit.

Referring to the block diagram of the inverse-transform circuit 63 shown in FIG. 8, the spectrum signal components in the respective bands supplied from the signal-component decoding circuit 62 are transformed into acoustic-wave components by a spectrum inverse-transform circuit 71 and 72, and the acoustic-wave components are then synthesized by a band synthesizing filter 73.

The detailed operation of the above-described decoding apparatus 51 is as follows. The code-string resolving circuit 61 resolves the input code string and supplies the resolved codes to the signal-component decoding circuit 62. The decoding circuit 62 dequantizes the input signal components together with the quantizing accuracy information and the normalizing-coefficient information. The dequantized signal components are then input into the spectrum inverse-transform circuits 71 and 72 of the inverse-transform circuit 63 in which the signal components are subjected to an inverse-MDCT operation. Thus, the spectrum signal components are transformed into acoustic-wave signal components, which are then synthesized by the band synthesizing filter 73 and are output.

If the output from the code-string generating circuit 13 illustrated in FIG. 1 is unnecessary, the output from the signal-component coding circuit 12 may be directly supplied to the compression-ratio changing circuit 15.

The preferred embodiment of the coding apparatus for acoustic-wave signals has been provided as explained above. The present invention may be used, not only for recording coded information on a recording medium, but also for transmitting coded information on a transmitting medium, such as a communication line. In particular, the present invention is effective for the type of processing which should be executed at high speed, for example, the processing required for transmitting stored codes, such as changing the compression ratio for each frame in response to a temporal change in the capacity of the transmitting channel of a transmitting medium.

As is seen from the foregoing description, the coding apparatus and the coding method of the present invention offer the following advantages. The quantizing accuracy and the normalizing coefficient are first calculated from a first code. A second code is then calculated from the first code with the use of the calculated quantizing accuracy and normalizing coefficient. It is thus possible to regenerate a code string having a changed compression ratio at high speed with a small number of calculations and a small size of the hardware.

What is claimed is:

1. A coding apparatus comprising:
   transform means for transforming an input signal into a spectrum component;
   normalization means for normalizing the spectrum component with the use of a first normalizing coefficient;
   quantization means for quantizing the normalized spectrum component into a first code with the use of a first quantizing accuracy;

first-calculation means for calculating a second quantizing accuracy and a second normalizing coefficient from said first code;

second-calculation means for calculating a second code from said first code with the use of said second quantizing accuracy and said second normalizing coefficient; and generating means for generating a code string from said second code.

2. A coding apparatus according claim 1, wherein said first-calculation means calculates the bit length of a code string to be generated and, upon comparison of the calculated bit length with a reference bit length, calculates said second quantizing accuracy and said second normalizing coefficient.

3. A coding apparatus according to claim 2, wherein said first-calculation means calculates said second quantizing accuracy by taking priority over said second normalizing coefficient.

4. A coding apparatus according to claim 1, wherein said first-calculation means uses said first quantizing accuracy used by said quantization means and said first normalizing coefficient used by said normalization means as initial values in determining said second quantizing accuracy and said second normalizing coefficient.

5. A coding method comprising the steps of:

a transform step of transforming an input signal into a spectrum component;

a normalization step of normalizing the spectrum component with the use of a first normalizing coefficient;

a quantization step of quantizing the normalized spectrum component into a first code with the use of a first quantizing accuracy;

a first-calculation step of calculating a second quantizing accuracy and a second normalizing coefficient from said first code;

a second-calculation step of calculating a second code from said first code with the use of said second quantizing accuracy and said second normalizing coefficient; and a generating step of generating a code string from said second code.

* * * * *